(12) United States Patent
Li et al.

(10) Patent No.: US 11,695,398 B2
(45) Date of Patent: Jul. 4, 2023

(54) FIXED TIME-DELAY CIRCUIT OF HIGH-SPEED INTERFACE

(71) Applicant: SHENZHEN PANGO MICROSYSTEMS CO., LTD., Shenzhen (CN)

(72) Inventors: Kai Li, Shenzhen (CN); Yuanjun Liang, Shenzhen (CN)

(73) Assignee: SHENZHEN PANGO MICROSYSTEMS CO., LTD.

( * ) Notice: Subject to any disclaimer, the term of this patent is extended or adjusted under 35 U.S.C. 154(b) by 0 days.

(21) Appl. No.: 17/775,906

(22) PCT Filed: Jul. 20, 2020

(86) PCT No.: PCT/CN2020/103018
§ 371 (c)(1),
(2) Date: May 11, 2022

(87) PCT Pub. No.: WO2021/143083
PCT Pub. Date: Jul. 22, 2021

(65) Prior Publication Data
US 2022/0385279 A1 Dec. 1, 2022

(30) Foreign Application Priority Data
Jan. 17, 2020 (CN) .......................... 202010058653.0

(51) Int. Cl.
*H03K 3/00* (2006.01)
*H03K 5/01* (2006.01)
(Continued)

(52) U.S. Cl.
CPC ............... *H03K 5/01* (2013.01); *H03K 3/037* (2013.01); *H03K 21/02* (2013.01); *H03K 2005/00078* (2013.01)

(58) Field of Classification Search
CPC .......... H03K 5/01; H03K 3/037; H03K 21/02; H03K 2005/00078; H03K 19/1737; H03K 17/28
(Continued)

(56) References Cited

U.S. PATENT DOCUMENTS 4,119,796 A * 10/1978 Jones ..................... H04L 7/0338
327/144
5,459,753 A * 10/1995 Co ....................... H04L 25/4904
375/362

(Continued)

FOREIGN PATENT DOCUMENTS

| CN | 103973312 A | 8/2014 |
|---|---|---|
| CN | 111224649 A | 6/2020 |

*Primary Examiner* — Ryan Jager

(57) ABSTRACT

A fixed time-delay circuit of a high-speed interface is disclosed. The fixed time-delay circuit comprises: a counter circuit for generating a shift selection signal of any bit; a data selector circuit for receiving first parallel data signals and rearranging the first parallel data signals according to the shift selection signal and a first low-speed clock to obtain second parallel data signals; a clock selector circuit for selecting, according to the shift selection signal, one clock from multiple input clocks having different phases, for outputting, to form a second low-speed clock; and a synchronization circuit for synchronizing the second parallel data signals according to the second low-speed clock. According to the circuit, initialization alignment among multichannel data of the high-speed interface can be achieved.

6 Claims, 3 Drawing Sheets

(51) Int. Cl.
*H03K 3/037* (2006.01)
*H03K 21/02* (2006.01)
*H03K 5/00* (2006.01)

(58) Field of Classification Search
USPC ........................................................ 327/199
See application file for complete search history.

(56) References Cited

U.S. PATENT DOCUMENTS

| | | | |
|---|---|---|---|
| 7,174,484 B2* | 2/2007 | Shimono | H04L 7/04 714/700 |
| 7,187,727 B2* | 3/2007 | Saeki | H04L 7/0337 329/307 |
| 7,498,965 B2* | 3/2009 | Jarman | H04L 49/901 341/101 |
| 2002/0009169 A1* | 1/2002 | Watanabe | H04L 25/14 327/237 |
| 2010/0254304 A1* | 10/2010 | Poegel | H04B 1/707 370/328 |
| 2012/0087307 A1* | 4/2012 | Poegel | H04B 1/707 370/328 |
| 2014/0218221 A1* | 8/2014 | Wortman | H04L 7/0012 341/100 |
| 2022/0385279 A1* | 12/2022 | Li | H03K 3/037 |

* cited by examiner

FIXED TIME-DELAY CIRCUIT OF HIGH-SPEED INTERFACE

FIELD OF THE DISCLOSURE

The application relates to the technical field of data transmission, in particular to a fixed time-delay circuit of high-speed interface.

BACKGROUND

During high-speed data transmission, the high-speed interface deserializes the high-speed serial data received by the receiving end into low-speed parallel data. During parallel transmission, each bit of the multi-bit data is simultaneously transmitted through parallel lines.

With the increase of the high-speed interface frequency, the data sampling point of the high-speed clock has less and less margin as the temperature and voltage change. Therefore, when sampling data based on a multi-channel high-speed clock, the delay of the data in different channels will be different, so that the initial data of the parallel data of each channel of the deserialization is not completely aligned, but there is a bit difference. Therefore, it is necessary to design the corresponding logic circuit to eliminate the delay between the multi-channels, so as to ensure the stability and reliability of the high-speed interface.

SUMMARY

To solve the above problems, the application provides a fixed delay circuit of a high-speed interface, which can realize the initialization alignment of multi-channel data of the high-speed interface.

The application provides a fixed time-delay circuit of a high-speed interface, comprising: a counter circuit for generating a shift select signal of any bit; a data selector circuit for receiving a first parallel data signal, rearranging said first parallel data signal into a second parallel data signal according to said shift select signal and a first low-speed clock, the position of the bit indicated by said second parallel data signal has the bit-shift number indicated by said shift select signal relative to the position of the bit indicated by said first parallel data signal; a clock selector circuit for selecting one clock as output from multiple input clocks with different phases according to said shift select signal, to form a second low-speed clock; a synchronous circuit for synchronizing said second parallel data signal according to said second low-speed clock.

Optionally, said data selector circuit comprising: a first D-flip-flop group, a second D-flip-flop group and a selector circuit, said first D-flip-flop group and said second D-flip-flop group comprises m D-flip-flops respectively, said selector circuit comprises m multiplexers, m is the number of channels included in the first parallel data signal, wherein the input of each D-flip-flop of said first D-flip-flop group corresponds to receive a corresponding signal of said first parallel data signal, the input of each D-flip-flop of said second D-flip-flop group is respectively connected to the output of each D-flip-flop of said first D-flip-flop group, the CLK input of each D-flip-flop of said first D-flip-flop group and each D-flip-flop of said second D-flip-flop group respectively receives said first low-speed clock; the output signals of the D-flip-flops of said second D flip-flop group constitute m input signals of said selector circuit which are respectively input to the m multiplexers, each of the multiplexers sequentially shifts each input signal by one bit according to said shift select signal input from the control port.

Optionally, said synchronous circuit comprising: a third D-flip-flop group, said third D-flip-flop group comprises m D-flip-flops, the input of each D-flip-flop of said third D-flip-flop group is respectively connected to the output of the corresponding multiplexer, the CLK input of each D-flip-flop of said third D-flip-flop group respectively receives said second low-speed clock.

Optionally, said first parallel data signal is obtained by deserializing the serial data through a deserializing circuit.

Optionally, the bit-shift number indicated by said shift select signal generated by said counter circuit is less than the maximum of the number of said first parallel data signals.

Optionally, said clock selector circuit comprising: a signal processing unit and a selector unit, wherein, said signal processing unit for processing the shift select signal, to make the processed shift select signal always synchronized with the clock to be switched; said selector unit for outputting said second low-speed clock according to the processed shift select signal.

The fixed time-delay circuit of a high-speed interface provided by the application, applied to data initialization alignment between different channels of multi-channel high-speed interface, the shift select signal can generate arbitrary count bit width signal, thereby making it possible to select the corresponding phase of the clock and to rearrange parallel data, the distance of any bit can be adjusted between multi-channel data, signal delays between data can be eliminated, ensure the stability and reliability of multi-channel work. The clock selector used at the same time can eliminate the burr when the clock is switched, and the practical effect is obvious.

DETAILED DESCRIPTION OF PREFERRED EMBODIMENTS

In order to make the purpose, technical scheme and advantages of this specification clearer, the technical scheme of this specification will be clearly and completely described in combination with the specific implementation examples of this specification and the corresponding appended drawings. Obviously, the described implementation is only part of this specification, not all of it. Based on the embodiments in this specification, all other embodiments obtained by ordinary technicians in the art without creative work belong to the scope of protection in this specification.

Figure 1:
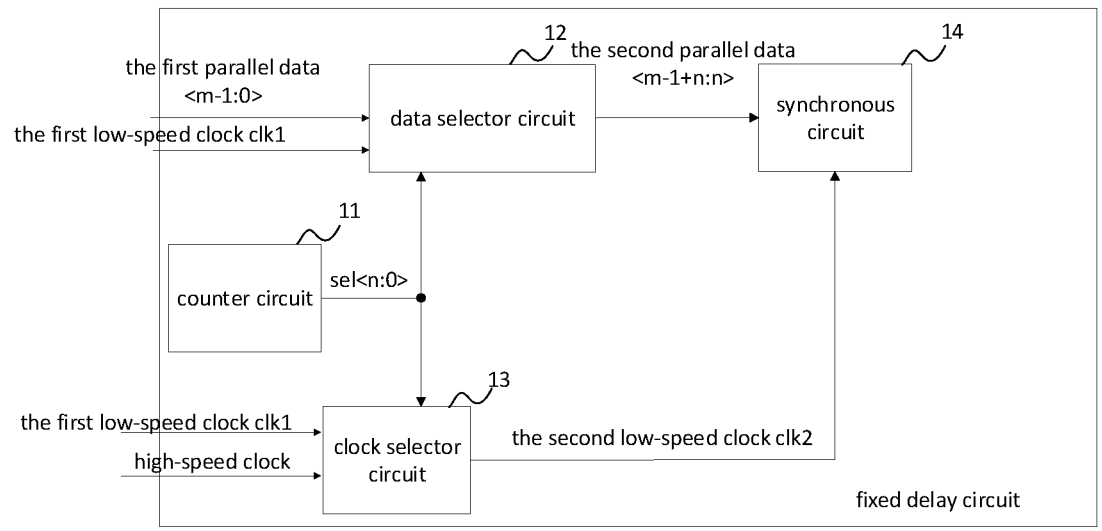
FIG. 1 is the structure diagram of the fixed time-delay circuit of the high-speed interface in the embodiment of the application.

The embodiment of the application provides a fixed time-delay circuit of the high-speed interface, as shown in FIG. 1, the circuit comprises: counter circuit 11 for generating a shift select signal of any bit; data selector circuit 12 for receiving a first parallel data signal, rearrange said first parallel data signal into a second parallel data signal according to said shift select signal and a first low-speed clock, the position of the bit indicated by said second parallel data signal has the bit-shift number indicated by said shift select signal relative to the position of the bit indicated by said first parallel data signal; clock selector circuit 13 for selecting one clock as output from multiple input clocks with different phases according to said shift select signal, to form a second low-speed clock; synchronous circuit 14 for synchronizing said second parallel data signal according to said second low-speed clock.

In this embodiment, counter circuit 11 generates the shift select signal sel<n:0> according to register configuration, data selector circuit 12 rearranges the first parallel data <m:0> which is obtained after deserialization, to select a new parallel data combination according to the shift select signal sel<n:0>, the result of the rearrangement is the second parallel data <m+n:+n>; clock selector circuit 13 selects the second low-speed clock clk2 of n phase according to the shift select signal sel<n:0>, synchronous circuit 14 synchronizes the second parallel data <m+n:+n> which is rearranged according to the second low-speed clock clk2 of n phase, then realize the relative shift of the data.

Figure 2:
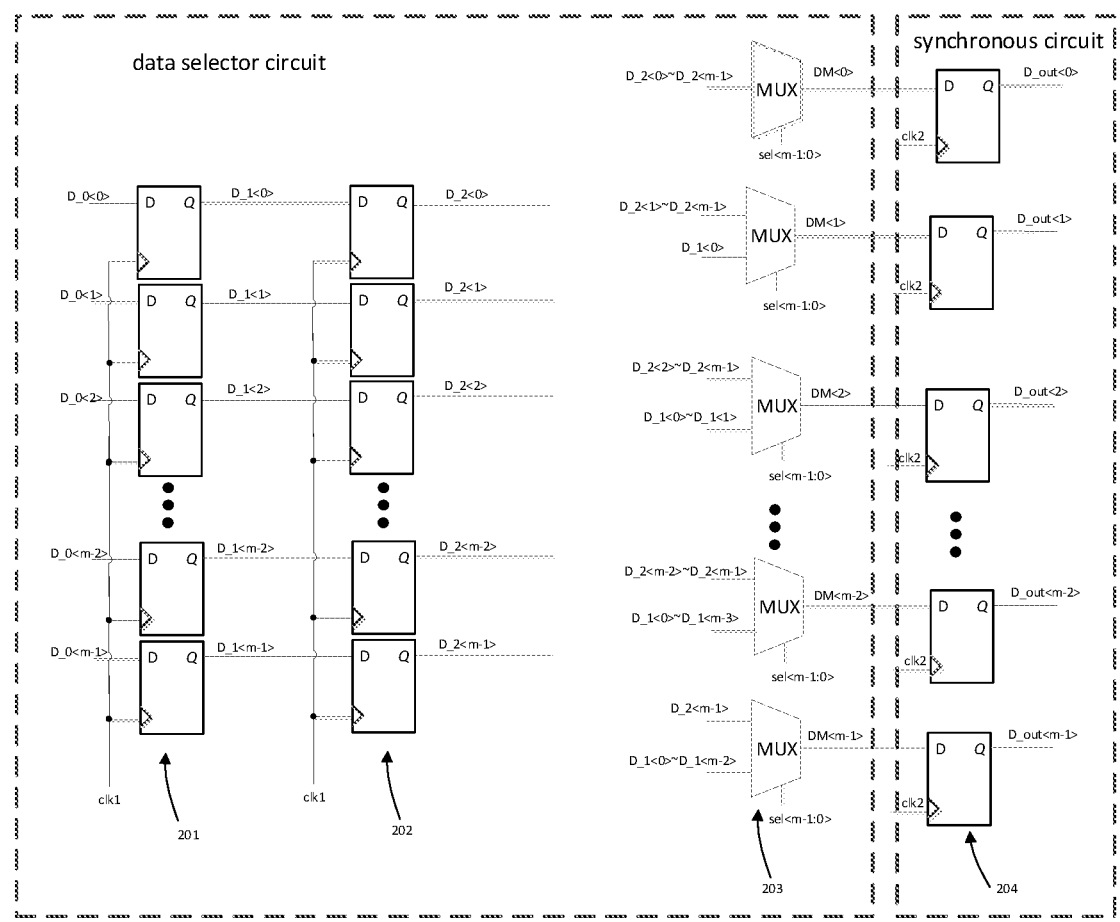
FIG. 2 is the structure diagram of the data selector circuit and the synchronous circuit in the embodiment of the application.

Optionally, FIG. 2 is a specific implementation structure diagram of the data selector circuit 12 and the synchronization circuit 14, data selector circuit 12 comprises: first D-flip-flop group 201, second D-flip-flop group 202 and selector circuit 203, the first D-flip-flop group 201 and the second D-flip-flop group 202 comprises m D-flip-flops respectively, the selector circuit 203 comprises m multiplexers, m is the number of channels included in the first parallel data signal, wherein the input of each D-flip-flop of the first D-flip-flop group corresponds to receive a corresponding signal of the first parallel data signal, the input of each D-flip-flop of the second D-flip-flop group is respectively connected to the output of each D-flip-flop of the first D-flip-flop group, the CLK input of each D-flip-flop of the first D-flip-flop group and each D-flip-flop of the second D-flip-flop group respectively receives the first low-speed clock; the output signals of the D-flip-flops of said second D flip-flop group constitute m input signals of said selector circuit which are respectively input to the m multiplexers, each of the multiplexers sequentially shifts each input signal by one bit according to said shift select signal input from the control port.

Synchronous circuit 14 comprises: third D-flip-flop group 204, the third D-flip-flop group 204 comprises m D-flip-flops, the input of each D-flip-flop of the third D-flip-flop group is respectively connected to the output of the corresponding multiplexer, the CLK input of each D-flip-flop of the third D-flip-flop group respectively receives the second low-speed clock.

If the data signal input from the data selector circuit 12 contains m-bit data words, where the bits in each data word are numbered 0-m-1, namely <m-1:0>, where bit 0 is the first bit in each data word, bit 1 is the second bit in each data word, and so on, bit m-1 is the m-th bit in each data word.

In the embodiment of FIG. 2, the deserialization circuit deserializes the serial data to generate m data signals D_0<0>~D_0<m-1> indicating m-bit data words, the data signals D_0<0> indicates the first bit received from the serial data, the data signals D_0<1> indicates the second bit received from the serial data, the data signals D_0<2> indicates the third bit received from the serial data, and so on, the data signals D_0<m-1> indicates.

Data signals D_0<0>~D_0<m-1> are correspondingly entered to the input of each D-lip-flop of the first D flip-flop group, the first low-speed clock clk1 is input to the CLK input of each D-flip-flop of the first D flip-flop group, each D-flip-flop of the first D-flip-flop group responds to each rising edge of the first low-speed clock clk1 to storage the value of data signal D_0<0>~D_0<m-1> at their Q outputs in data signals D_1<0>~D_1<m-1> correspondingly.

Data signals D_0<0>~D_0<m-1> are correspondingly entered to the input of each D-lip-flop of the second D flip-flop group, the first low-speed clock clk1 is input to the CLK input of each D-flip-flop of the second D flip-flop group, each D-flip-flop of the second D-flip-flop group responds to each rising edge of the first low-speed clock clk1 to storage the value of data signals D_0<0>~D_0<m-1> at their Q outputs in data signals D_2<0>~D_2<m-1> correspondingly.

Data signals D_2<0~D_2<m-1> are correspondingly input to the multiplexed input of first multiplexer, data signals D_2<1>~D_2<m-1> and data signal D_1<0> are correspondingly input to the multiplexed input of second multiplexer, data signals D_2<2>~D_2<m-1> and data signals D_1<0>~D_1<1> are correspondingly input to the multiplexed input of third multiplexer, and so on, the multiplexed input of each multiplexer is sequentially shifted by one bit, data signals D_2<m-2>~D_2<m-1> and data signals D_1<0>~D_1<m-3> are correspondingly input to the multiplexed input of the m-1th multiplexer, data signal D_2<m-1> and data signals D_1<0>~D_1<m-2> are correspondingly input to the multiplexed input of the m-th multiplexer, the shift select signal sel<n:0> is input to the control port of each multiplexer.

M multiplexers correspondingly generate data signals DM<0>~DM<m-1> at their outputs based on the value of the shift select signal sel<n:0> and the signals of their multiplexed inputs.

Data signals DM<0>~DM<m-1> are correspondingly entered to the input of each D-lip-flop of the second D-flip-flop group 204, the second low-speed clock clk2 is input to the CLK input of each D-flip-flop of the third D-flip-flop group, each D-flip-flop of the third D-flip-flop group responds to each rising edge of the second low-speed clock clk2 to storage the value of data signals DM<0>~DM<m-1> at their Q outputs in data signals D_out<0>~D_out<m-1> correspondingly.

M multiplexers select the output signal of each selector according to the value n (0≤n≤m-1) of the shift select signal sel<n>, thus forming new low-speed parallel data <m+n:n>.

If the value of shift select signal sel<n:0> is equal to 0, then the m multiplexers provide the values of the data signals D_2<0>~D_2<m-1> to the data signals DM<0>~DM<m-1> accordingly; if the value of shift select signal sel<n:0> is equal to 1, then the m multiplexers provide the values of the data signals D_2<1>~D_2<m-1> and data signal D_1<0> to the data signals DM<0>~DM<m-1> accordingly; and so on, if the value of shift select signal sel<n:0> is equal to m-1, then the m multiplexers provide the values of the data signal D_2<m-1> and the data signals D_1<0>~D_1<m-2> to the data signals DM<0>~DM<m-1> accordingly.

Figure 3:
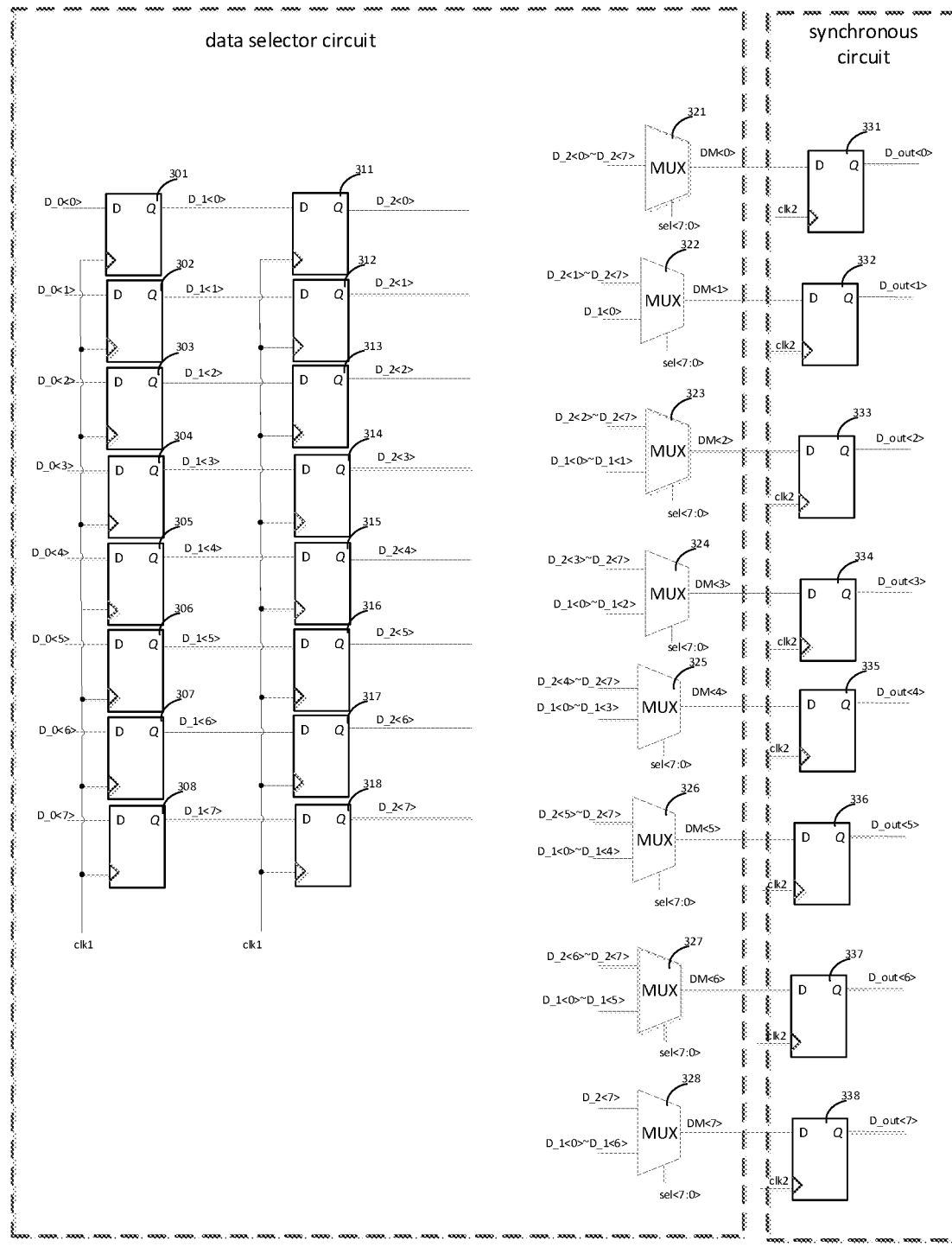
FIG. 3 is the structure diagram of the data selector circuit and the synchronous circuit in the embodiment of the application.

As an example, as shown in FIG. 3, the deserialization circuit deserializes the serial data to generate 8 data signals D_0<0>~D_0<7> indicating 8-bit data words, data signal D_0<0> indicates the first bit received from serial data, data signal D_0<1> indicates the second bit received from serial data, data signal D_0<2> indicates the third bit received from serial data, and so on, data signal D_0<7> indicates most recently received bit from the serial data.

Data signals D_0<0>~D_0<7> are correspondingly entered to the input of the respective D-flip-flops 301-308 of the first D-flip-flop group, the first low-speed clock clk1 is input to the CLK input of each D-flip-flop 301-308 of the first D-flip-flop group, each D-flip-flop 301-308 of the first D-flip-flop group responds to each rising edge of the first low-speed clock clk1 to storage the value of data signals D_0<0>~D_0<7> at their Q outputs in data signals D_1<0>~D_1<7> correspondingly.

Data signals D_1<0>~D_1<7> are correspondingly entered to the input of the respective D-flip-flops 311-318 of the second D-flip-flop group, the first low-speed clock clk1 is input to the CLK input of each D-flip-flop 311-318 of the second D-flip-flop group, each D-flip-flop 311-318 of the second D-flip-flop group responds to each rising edge of the first low-speed clock clk1 to storage the value of data signals D_1<0>~D_1<7> at their Q outputs in data signals D_2<0>~D_2<7> correspondingly.

Data signals D_2<0>~D_2<7> are correspondingly input to the multiplexed input of the multiplexer 321, data signals D_2<1>~D_2<7> and data signal D_1<0> are correspondingly input to the multiplexed input of the multiplexer 322, data signals D_2<2>~D_2<7> and data signals D_1<0>~D_1<1> are correspondingly input to the multiplexed input of the multiplexer 323, data signals D_2<3>~D_2<7> and data signals D_1<0>~D_1<2> are correspondingly input to the multiplexed input of the multiplexer 324, data signals D_2<4>~D_2<7> and data signals D_1<0>~D_1<3> are correspondingly input to the multiplexed input of the multiplexer 325, data signals D_2<5>~D_2<7> and data signals D_1<0>~D_1<4> are correspondingly input to the multiplexed input of the multiplexer 326, data signals D_2<6>~D_2<7> and data signals D_1<0>~D_1<5> are correspondingly input to the multiplexed input of the multiplexer 327, data signal D_2<7> and data signals D_1<0>~D_1<6> are correspondingly input to the multiplexed input of the multiplexer 328, the shift select signal sel<n:0> is input to the control port of each of the multiplexers 321-328.

8 multiplexers 321-328 correspondingly generate data signals DM<0>~DM<7> at their outputs based on the value of the shift select signal sel<n:0> and the signals of their multiplexed inputs.

Data signals DM<0>~DM<7> are correspondingly entered to the input of each D-lip-flop 331-338 of the second D-flip-flop group 204, the second low-speed clock clk2 is input to the CLK input of each D-flip-flop 331-338 of the third D-flip-flop group, each D-flip-flop of the third D-flip-flop group responds to each rising edge of the second low-speed clock clk2 to storage the value of data signals DM<0>—DM<7> at their Q outputs in data signals D_out<0>~D_out<7> correspondingly.

If the value of shift select signal sel<7:0> is equal to 0, then the 8 multiplexers provide the values of the data signals D_2<0>~D_2<7> to the data signals DM<0>~DM<7> accordingly; if the value of shift select signal sel<7:0> is equal to 1, then the 8 multiplexers provide the values of the data signals D_2<1>—D_2<7> and data signal D_1<0> to the data signals DM<0>~DM<7> accordingly; and so on, if the value of shift select signal sel<7:0> is equal to 7, then the 8 multiplexers provide the values of the data signal D_2<7> and the data signals D_1<0>~D_1<6> to the data signals DM<0>~DM<7> accordingly.

Further, in this embodiment, the clock selector circuit comprising: signal processing unit and selector unit, wherein, the signal processing unit for processing the shift select signal, to make the processed shift select signal always synchronized with the clock to be switched; the selector unit for outputting the second low-speed clock according to the processed shift select signal.

The fixed time-delay circuit of the high-speed interface provided by the embodiments of the application, applied to data initialization alignment between different channels of multi-channel high-speed interface, the shift select signal can generate arbitrary count bit width signal, thereby making it possible to select the corresponding phase of the clock and to rearrange parallel data, the distance of any bit can be adjusted between multi-channel data, signal delays between data can be eliminated, ensure the stability and reliability of multi-channel work. The clock selector used at the same time can eliminate the burr when the clock is switched, and the practical effect is obvious.

The above are only specific embodiments of the application, but the protection scope of the application is not limited thereto. Any person skilled in the art who is familiar with the technical scope disclosed by the application can easily think of changes or substitutions. All should be included within the protection scope of the application. Therefore, the protection scope of the application should be subject to the protection scope of the claims.

What is claimed is:

1. A fixed time-delay circuit of a high-speed interface, comprising:
    a counter circuit for generating a shift select signal of any bit;
    a data selector circuit for receiving a first parallel data signal, rearranging said first parallel data signal into a second parallel data signal according to said shift select signal and a first low-speed clock, the position of the bit indicated by said second parallel data signal has the bit-shift number indicated by said shift select signal relative to the position of the bit indicated by said first parallel data signal;
    a clock selector circuit for selecting one clock as output from multiple input clocks with different phases according to said shift select signal, to form a second low-speed clock; and
    a synchronous circuit for synchronizing said second parallel data signal according to said second low-speed clock.

2. The fixed time-delay circuit of a high-speed interface of claim 1, wherein said data selector circuit comprising:
    a first D-flip-flop group, a second D-flip-flop group and a selector circuit, said first D-flip-flop group and said second D-flip-flop group comprises m D-flip-flops respectively, said selector circuit comprises m multiplexers, m is the number of channels included in the first parallel data signal, wherein the input of each D-flip-flop of said first D-flip-flop group corresponds to receive a corresponding signal of said first parallel data signal, the input of each D-flip-flop of said second D-flip-flop group is respectively connected to the output of each D-flip-flop of said first D-flip-flop group, the CLK input of each D-flip-flop of said first D-flip-flop group and each D-flip-flop of said second D-flip-flop group respectively receives said first low-speed clock;
    the output signals of the D-flip-flops of said second D flip-flop group constitute m input signals of said selector circuit which are respectively input to the m multiplexers, each of the multiplexers sequentially shifts each input signal by one bit according to said shift select signal input from the control port.

3. The fixed time-delay circuit of a high-speed interface of claim 2, wherein said synchronous circuit comprising:
    a third D-flip-flop group, said third D-flip-flop group comprises m D-flip-flops, the input of each D-flip-flop of said third D-flip-flop group is respectively connected to the output of the corresponding multiplexer, the CLK input of each D-flip-flop of said third D-flip-flop group respectively receives said second low-speed clock.

4. The fixed time-delay circuit of a high-speed interface of claim 1, wherein said first parallel data signal is obtained by deserializing the serial data through a deserializing circuit.

5. The fixed time-delay circuit of a high-speed interface of claim 1, wherein the bit-shift number indicated by said shift select signal generated by said counter circuit is less than the maximum of the number of said first parallel data signals.

6. The fixed time-delay circuit of a high-speed interface of claim 1, wherein said clock selector circuit comprising:
  a signal processing unit and a selector unit, wherein,
    said signal processing unit for processing the shift select signal, to make the processed shift select signal always synchronized with the clock to be switched; and
    said selector unit for outputting said second low-speed clock according to the processed shift select signal.

* * * * *